United States Patent
Kim et al.

(10) Patent No.: US 7,943,985 B2
(45) Date of Patent: May 17, 2011

(54) OXIDE SEMICONDUCTOR THIN FILM TRANSISTORS AND FABRICATION METHODS THEREOF

(75) Inventors: Tae-sang Kim, Seoul (KR); Sang-yoon Lee, Seoul (KR); Myung-kwan Ryu, Yongin-si (KR); Jang-yeon Kwon, Seongnam-si (KR); Kyung-bae Park, Seoul (KR); Kyung-seok Son, Seoul (KR); Ji-sim Jung, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 356 days.

(21) Appl. No.: 12/219,661

(22) Filed: Jul. 25, 2008

(65) Prior Publication Data

US 2009/0140243 A1      Jun. 4, 2009

(30) Foreign Application Priority Data

Nov. 30, 2007   (KR) .................. 10-2007-0123809

(51) Int. Cl.
*H01L 29/66* (2006.01)

(52) U.S. Cl. . 257/327; 257/288; 257/404; 257/E29.277; 257/E29.273; 438/197; 438/149; 438/479; 438/217; 324/248

(58) Field of Classification Search ................ 324/248; 257/E29.277, E29.117, E29.273, 213, 288, 257/327, 347, 404; 438/197, 149, 479, 517, 438/217

See application file for complete search history.

(56) References Cited

U.S. PATENT DOCUMENTS

| 5,656,825 | A * | 8/1997 | Kusumoto et al. | 257/66 |
| 2006/0113523 | A1* | 6/2006 | Kubota et al. | 257/40 |
| 2007/0152219 | A1* | 7/2007 | Lim | 257/59 |

* cited by examiner

*Primary Examiner* — Evan Pert
*Assistant Examiner* — Scott Wilson
(74) *Attorney, Agent, or Firm* — Harness, Dickey & Pierce, P.L.C.

(57) ABSTRACT

Oxide semiconductor thin film transistors (TFT) and methods of manufacturing the same are provided. The methods include forming a channel layer on a substrate, forming source and drain electrodes at opposing sides of the channel layer, and oxidizing a surface of the channel layer by placing an oxidizing material in contact with the surface of the channel layer, reducing carriers on the surface of the channel layer. Due to the oxidizing agent treatment of the surface of the channel layer, excessive carriers that are generated naturally, or during the manufacturing process, may be more effectively controlled.

20 Claims, 5 Drawing Sheets

OXIDE SEMICONDUCTOR THIN FILM TRANSISTORS AND FABRICATION METHODS THEREOF

PRIORITY STATEMENT

This application claims the benefit of priority under 35 U.S.C §119 to Korean Patent Application No. 10-2007-0123809, filed on Nov. 30, 2007 in the Korean Intellectual Property Office, the contents of which are incorporated herein by reference in their entirety.

BACKGROUND

1. Field

Example embodiments relate to oxide semiconductor thin film transistors (TFT) and methods of manufacturing an oxide semiconductor thin film transistor (TFT). Other example embodiments relate to zinc oxide (ZnO) based semiconductor thin film transistors (TFT) and methods of manufacturing a zinc oxide (ZnO) based semiconductor TFT.

2. Description of the Related Art

A thin film transistor (TFT) using a semiconductor thin film may be applied to various fields. For example, a TFT is frequently used as an active device of a flat panel display device. An oxide semiconductor (e.g., a ZnO based semiconductor film) may be manufactured in a substantially low temperature process. A GaInZnO (GIZO) semiconductor may be amorphous. As such, a substantially large surface device may be manufactured using GIZO. A ZnO based semiconductor film may have a substantially high mobility. A ZnO may have desirable electrical characteristics like a poly-crystalline silicon.

The carrier density of a ZnO based semiconductor film may be sensitive to changes in oxygen content. The electrical characteristics of the ZnO based semiconductor may fluctuate due to thermal and/or chemical impact. If a channel is exposed to plasma during the manufacturing of a ZnO based thin film transistor, the channel may be damaged. The channel may be damaged by plasma having a substantially large amount of energy that is used for patterning a source and a drain. The damage may undesirably increase the carrier density on a surface of the channel. The increase in carrier density may cause a shift in a threshold voltage of the thin film transistor. The shifted threshold voltage may have a substantially large negative value. As such, a leakage current may be generated between the source and the drain even if a gate voltage is 0 V.

SUMMARY

Example embodiments relate to oxide semiconductor thin film transistors (TFT) and methods of manufacturing an oxide semiconductor thin film transistor (TFT). Other example embodiments relate to zinc oxide (ZnO) based semiconductor thin film transistors (TFT) and methods of manufacturing a zinc oxide (ZnO) based semiconductor TFT.

Example embodiments provide fabrication methods of an oxide semiconductor thin film transistor that may control carrier density on the surface of a channel thereof.

Example embodiments also provide fabrication methods of an oxide semiconductor thin film transistor that may simplify a fabrication process and/or lower fabrication costs.

According to example embodiments, there is provided a method of manufacturing an oxide semiconductor thin film transistor, the method including forming an oxide semiconductor channel layer and source and drain electrodes at both (or opposing) sides of the channel layer on a substrate, and oxidizing a surface of the channel layer by placing an oxidizing material in contact with the surface of the channel layer.

The oxidizing material may be at least one of a liquid oxidizing agent and a self-assembled monolayer (SAM) formed on the surface of the channel layer.

The method may include forming a gate on the substrate prior to forming the channel layer. An insulating layer may be formed on the substrate and over the gate. The channel layer, and the source and drain electrodes, may be formed on the insulating layer.

The method of manufacturing an oxide semiconductor thin film transistor may include forming a passivation layer, which covers the channel and the source and drain, using a material including a functional group capable of oxidizing the channel layer.

The source and drain may be formed by deposition of a conductive material layer, and patterning of the conductive material layer using a wet etchant. The source and drain electrodes may be formed prior to forming the oxide semiconductor channel layer.

In the above-described method, the channel layer may be formed using a physical vapor deposition (PVD) method including a sputtering method and an evaporation method. The gate insulating layer may be formed of silicon nitride ($SiN_x$). The channel layer may be formed of GaInZnO (GIZO).

The conductive material layer may include at least one stack (or multiple layers). The conductive material layer may be formed of at least one material selected from the group consisting of Mo, Ti, Pt, Cu, Al, W, MoW, AlNd, Ni, Ag, Au, IZO, ITO and combinations thereof. The conductive material layer may include at least one metal selected from the group consisting of Cu, Mo, Al and combinations thereof.

According to example embodiments, the channel layer, which is a ZnO based channel layer, may be an $a(In_2O_3) \cdot b(Ga_2O_3) \cdot c(ZnO)$ layer where a, b and c are actual numbers respectively satisfying the following expression: $a \geq 0$, $b \geq 0$ and $c > 0$.

According to example embodiments, the channel layer may be an $a(In_2O_3) \cdot b(Ga_2O_3) \cdot c(ZnO)$ layer where a, b and c are actual numbers respectively satisfying the following expressions: $a \geq 1$, $b \geq 1$, and $0 < c \leq 1$.

BRIEF DESCRIPTION OF THE DRAWINGS

Example embodiments will be more clearly understood from the following detailed description taken in conjunction with the accompanying drawings. FIGS. 1A-3E represent non-limiting, example embodiments as described herein.

FIG. 1A is a cross-sectional view of a bottom contact type bottom gate transistor manufactured using a method according to example embodiments;

FIGS. 3A through 3E illustrate another method of manufacturing a transistor according to example embodiments.

DETAILED DESCRIPTION OF EXAMPLE EMBODIMENTS

Figure 1A:
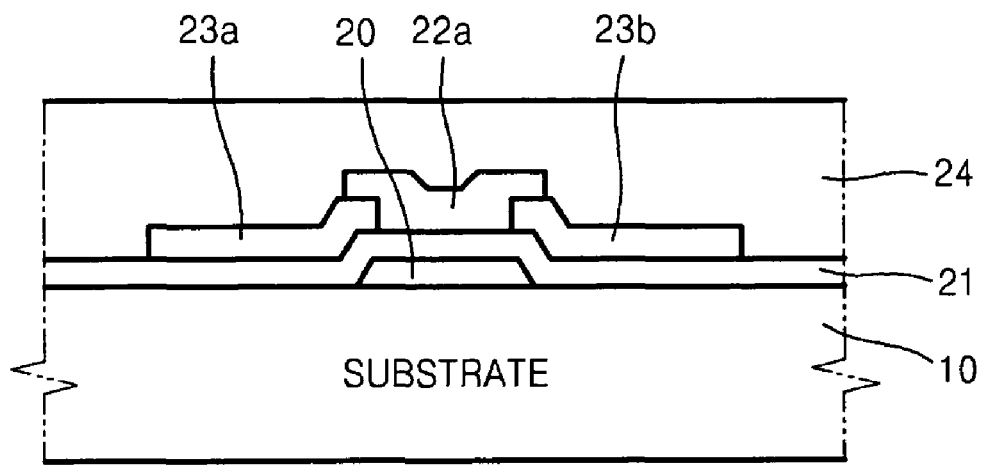

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation that is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

The endpoints of all ranges directed to the same component or property are inclusive of the endpoint and independently combinable (e.g., ranges of "up to about 25 wt. %, or, more specifically, about 5 wt. % to about 20 wt. %," are inclusive of the endpoints and all intermediate values of the range of about 5 wt. % to about 25 wt. %. The modifier "about" used in connection with a quantity is inclusive of the stated value and has the meaning dictated by the context (e.g., includes the degree of error associated with measurement of the particular quantity).

Example embodiments relate to oxide semiconductor thin film transistors (TFT) and methods of manufacturing an oxide semiconductor thin film transistor (TFT). Other example embodiments relate to zinc oxide (ZnO) based semiconductor thin film transistors (TFT) and methods of manufacturing a zinc oxide (ZnO) based semiconductor TFT.

Figure 1B:
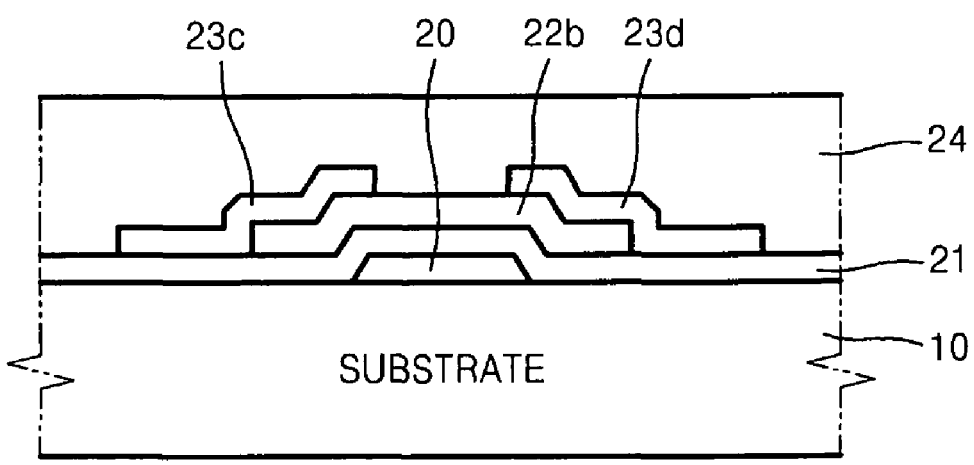
FIG. 1B is a cross-sectional view of a top contact type bottom gate transistor manufactured using a method according to example embodiments.

FIGS. 1A and 1B are schematic views illustrating a bottom gate oxide semiconductor thin film transistor (TFT) manufactured according to example embodiments.

FIG. 1A illustrates a bottom contact type transistor in which a source and drain contact lower sides of a channel. FIG. 1B illustrates a top contact type transistor in which a source and a drain contact upper sides of a channel.

Referring to FIG. 1A, a gate 20 and an insulating layer 21 covering the gate 20 may be formed on a substrate 10. A channel layer 22a corresponding to the gate 20 may be formed on the insulating layer 21. A source electrode 23a and a drain electrode 23b may be formed on a lower portion of both (or opposing) sides of the channel layer 22a, respectively. A passivation layer 24 may be formed on the channel layer 22a.

Referring to FIG. 1B, a gate 20 and a gate insulating layer 21 covering the gate 20 may be formed on a substrate 10. A channel layer 22b corresponding to the gate 20 may be formed on the gate insulating layer 21. A source electrode 23c and a drain electrode 23d may be formed on an upper portion of opposing sides of the channel layer 22b. A passivation layer 24 may be formed on the channel layer 22b.

The substrate 10 may be formed of a transparent or opaque material example (e.g., silicon, glass, metal foil, plastic, etc.). The channel layers 22a and 22b may be formed of a ZnO based material (e.g., Ga—In—Zn—O (GIZO)). GIZO may be formed of $a(In_2O_3) \cdot b(Ga_2O_3) \cdot c(ZnO)$ where a, b and c are actual numbers respectively satisfying the following expression: $a \geq 0$, $b \geq 0$ and $c > 0$. GIZO may be formed of $a(In_2O_3) \cdot b(Ga_2O_3) \cdot c(ZnO)$ where a, b and c are actual numbers respectively satisfying the following expressions: $a \geq 1$, $b \geq 1$, and $0 < c \leq 1$.

The channel layers 22a and 22b formed of GIZO may be formed using a physical vapor deposition (PVD) method including a sputtering method or an evaporation method. The carrier density of a surface of the channel layers 22a and 22b may be controlled by oxidization using an oxidizing agent.

Examples of the oxidizing agent may include [$MnO_4$]-permanganate, [$ClO_4$]-perchlorate, peroxide compounds and combinations thereof. The oxidizing agent may be supplied by an oxygen-containing self-assembled monolayer (SAM) formed on the surface of the channel layers 22a and 22b. The SAM, which is formed on the surface of the channel layers 22a and 22b, may have a very (or substantially) small thickness.

The source electrodes 23a and 23c and the drain electrodes 23b and 23d may be formed of a metal. Examples of the metal include Mo, Ti, Pt, Cu, Al, W, MoW, AlNd, Ni, Ag, Au, IZO, ITO and combinations thereof. The source electrodes 23a and 23c and the drain electrodes 23b and 23d may be formed of at least one of a copper (Cu) or molybdenum (Mo) single metal layer, a multi-metal layer including a molybdenum (Mo) layer, a metal layer including titanium (Ti), and a metal layer including chromium (Cr).

The passivation layer 24 having a substantially large thickness may be formed on the channel layers 22a and 22b, the source electrodes 23a and 23c and the drain electrodes 23b and 23d. The passivation layer 24 may be formed of a silicon nitride (SiNx) or a silicon oxide ($SiO_x$). If the passivation layer 24 is formed by a plasma enhanced chemical vapor deposition (PECVD) method, the passivation layer 24 may be formed of $SiO_2$ in order to prevent (or reduce) damage of the surface of the channel layers 22a and 22b. According to example embodiments, the passivation layer 24 may be formed of an organic material having a functional group capable of oxidizing the channel layers 22a and 22b (e.g., poly acrylic acid, poly ethylene oxide, poly propylene oxide and the like).

The channel layers 22a and 22b may have thickness of about 30 nm to about 200 nm. The source electrode 23a and the drain electrode 23b may have thickness of about 10 nm to about 200 nm. The gate insulating layer 21 may have thickness of about 100 nm to about 500 nm. The gate 20 may be about 100 nm to 300 nm.

An ohmic contact layer (not shown) may be formed between the channel layer 22a and the source electrode 23a and between the channel layer 22a and the drain electrode 23b, respectively. The ohmic contact layer may be a conductive oxide layer having a lower oxygen content than the channel layer 22a. The ohmic contact layer reduces contact resistance between the channel layer 22a and 22b and the source and drain electrodes 23a, 23c and 23b, 23d.

The channel layers 22a and 22b may be formed using a sputtering method and an evaporation method. In the case of using an RF sputtering method, RF power may be about 100 W to about 1000 W. Argon (Ar) and oxygen ($O_2$) may be used as gas flowing into a chamber during sputtering. The manufacturing process may be performed such that, if the flux of argon (Ar) is 100 sccm, the flux of oxygen ($O_2$) is in a range of 0 sccm to 100 sccm.

Hereinafter, methods of manufacturing an oxide semiconductor TFT according to example embodiments will be described with reference to attached drawings.

FIGS. 2A through 2E are schematic views illustrating a method of manufacturing a bottom contact type bottom gate oxide TFT according to example embodiments. Similar reference numerals and symbols in FIGS. 2A through 2E as in FIG. 1A denote like elements. Therefore, a description thereof will be omitted for the same of brevity.

Figure 2A:
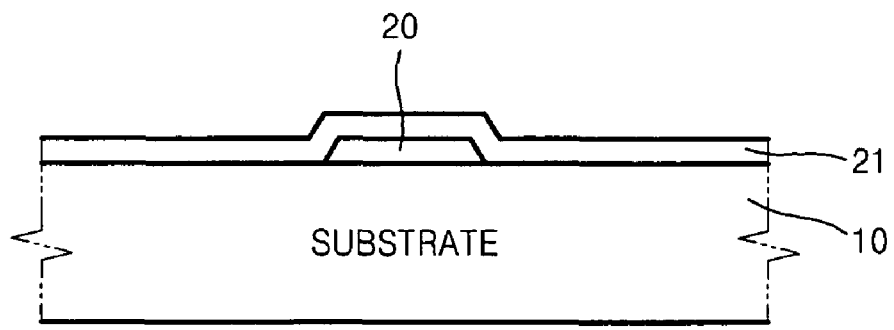
FIGS. 2A through 2E illustrate a method of manufacturing a transistor according to example embodiments.

Referring to FIG. 2A, a gate 20 may formed on a substrate 10. A gate insulating layer 21 covering the gate 20 may be formed on the substrate 10. The gate insulating layer 21 may be a $SiO_x$ (e.g., $SiO_2$ or $SiN_x$ layer. After forming the gate insulating layer 21, a wet washing process may be performed to eliminate (or remove) impurities on a top surface of the gate insulating layer 21. During the wet washing process, at least one of isopropyl (IPA), deionized water, acetone or the like may be used as a washing solution.

Figure 2B:
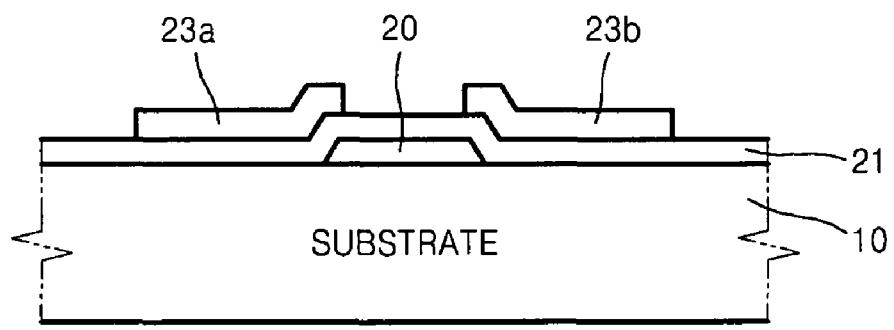

Referring to FIG. 2B, a conductive material layer (not shown) may be formed on the gate insulating layer 21. The conductive material layer may be patterned to form a source electrode 23a and a drain electrode 23b. A general dry, and/or wet, method may be used for patterning the source electrode 23a and the drain electrode 23b. In the case of a wet method, an etchant having phosphoric acid, nitric acid, acetic acid or the like as a main (or primary) component may be used.

The patterned conductive material layer, or the source electrode 23a and the drain electrode 23b, obtained may be one of a molybdenum (Mo) single metal layer, a multi-metal layer including a molybdenum (Mo) layer, a metal layer including titanium (Ti), and a metal layer including chromium (Cr).

The conductive material layer, or the source electrode 23a and the drain electrode 23b, may be formed of a conductive material including at least one of Mo, Ti, Pt, Cu, Al, W, MoW, AlNd, Ni, Ag, Au, IZO, ITO and combinations thereof. The conductive material layer or the source electrode 23a and the drain electrode 23b may be formed of a silicide including at least one of Mo, Ti, Pt, Cu, Al, W, MoW, AlNd, Ni, Ag, Au, IZO, ITO and combinations thereof. The conductive material, or the silicide, used to form the conductive material layer, or the source electrode 23a and the drain electrode 23b may include at least one of Cu, Mo, Al and combinations thereof. The conductive material layer may be formed using a PVD method.

Figure 2C:
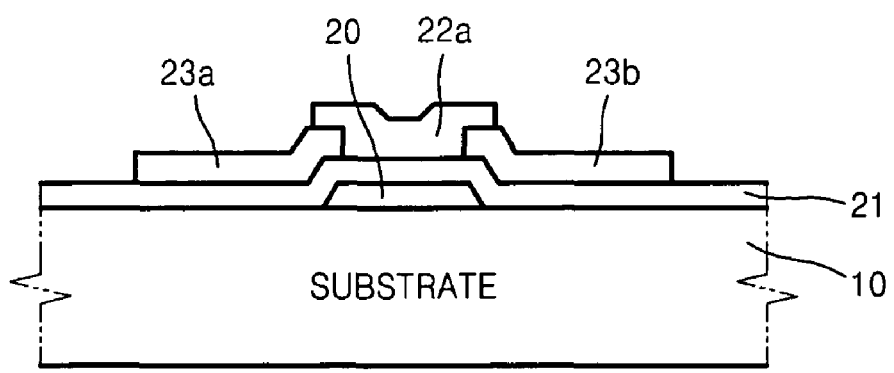

Referring to FIG. 2C, a channel layer 22a corresponding to the gate 20 may be formed on the gate insulating layer 21 between the source electrode 23a and the drain electrode 23b. The channel layer 22a may be formed using a PVD method including general sputtering and evaporation methods. If the channel layer 22a is formed using a PVD method, at least one target of $In_2O_3$, $Ga_2O_3$, ZnO or combinations thereof may be used in the PVD method.

Figure 2D:
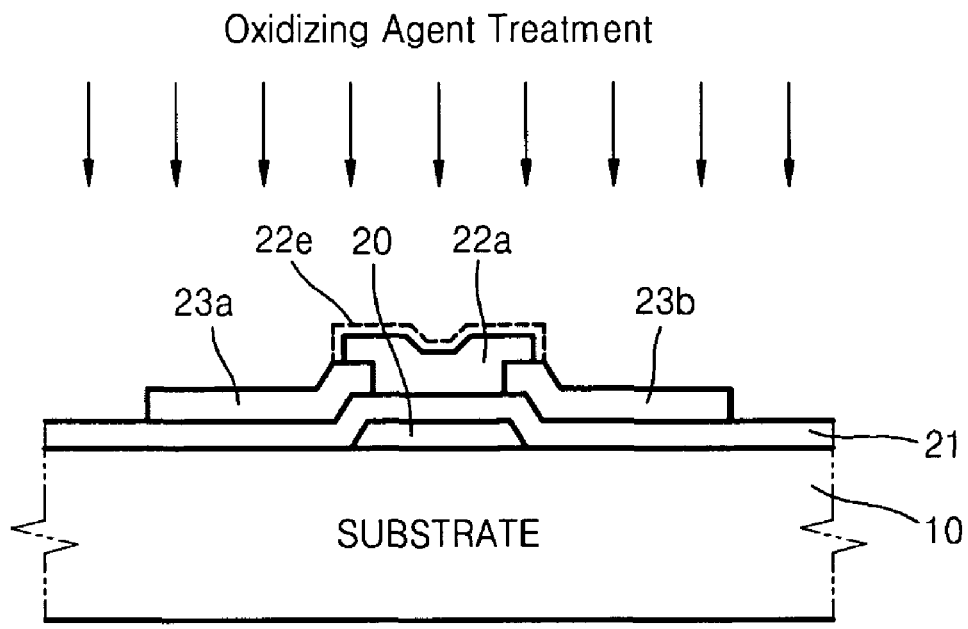

Referring to FIG. 2D, an oxidation treatment using an oxidizing agent may be performed. Carriers formed on a surface of the channel layer 22a may decrease due to the oxidation treatment. The carriers formed on the surface of the channel layer 22a may be natural carriers that are created (or formed) during a preceding process. The carriers formed on the surface of the channel layer 22a may have a higher density than carriers below the surface of the channel layer 22a. As such, the surface of the channel layer 22a may be oxidized using the oxidizing agent.

The oxidation treatment may include placing a liquid oxidizing agent in contact with the surface of the channel layer 22a. The oxidation treatment may include forming a self-assembled monolayer (SAM) 22e on the surface of the channel layer 22a. The SAM may include an oxidizing agent component that oxidizes the surface of the channel layer 22a. Examples of the liquid oxidizing agent include [$MnO_4$]-permanganate, [$ClO_4$]-perchlorate, peroxide compounds and the like. SAM may be formed of a trichloro or trialkoxy silane group containing SAM, a phosphonic acid group containing SAM, Hexa Methyl Di Silazane (HMDS) or the like.

Figure 2E:
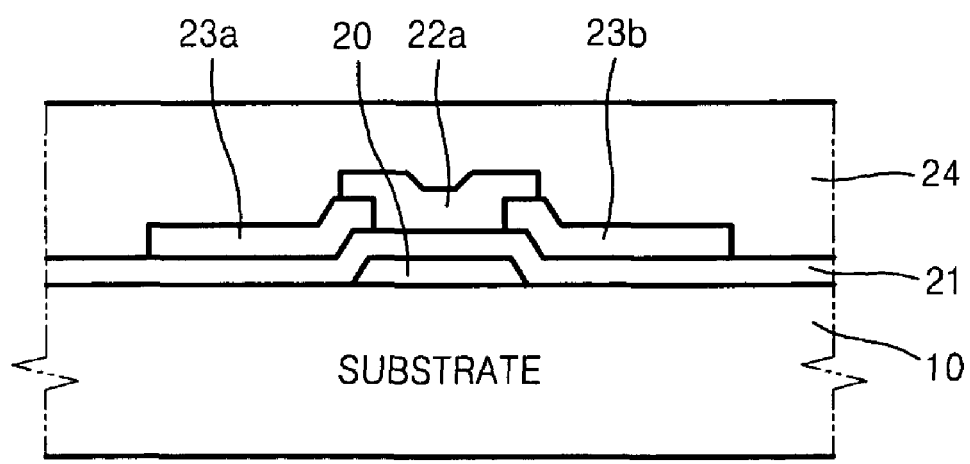

Referring to FIG. 2E, a passivation layer 24 may be formed on the channel layer 22a, the gate insulating layer 21, the source electrode 23a and the drain electrode 23b by using a known deposition method (e.g., a PECVD method). The passivation layer 24 may be formed of $SiN_x$ or $SiO_x$. It may be desirable to use $SiO_x$ for controlling the carrier density of the channel layer 22a, which is increased due to plasma damage during formation of the passivation layer 24. The passivation layer 24 may be formed of a known organic insulating material, in addition to, the above-described inorganic materials.

It may be desirable to use an organic insulating material including a functional group, which is capable of oxidizing the channel layer 22a, in order to control carriers on the surface of the channel layer 22a. According to example embodiments, if the passivation layer 24 is formed of an organic material including such a functional group, the additional oxidizing agent process and SAM formation described above may be excluded. As such, the passivation layer 24 may be formed using an organic insulating material including a functional group directly after forming the channel layer 22a. It may be necessary to cure the passivation layer 24 formed of an organic insulating material at a desired temperature (e.g., at about 200° C.).

FIGS. 3A through 3D are schematic views illustrating a method of manufacturing a bottom contact type bottom gate oxide TFT. Like reference numerals and symbols in FIGS. 2A and FIGS. 3A through 3D denote like elements.

Figure 3A:
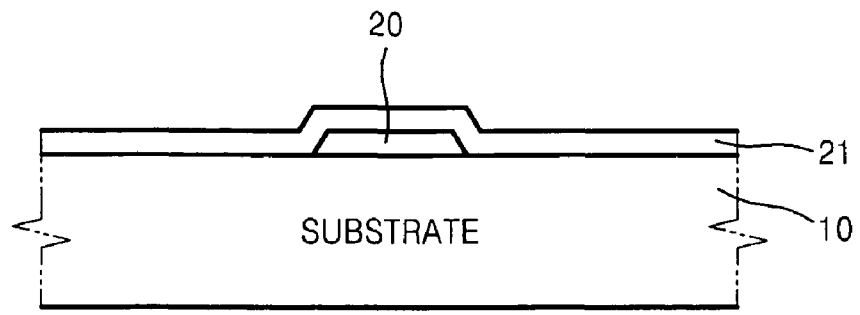

Referring to FIG. 3A, a gate 20 may be formed on a substrate 10. A $SiO_x$ (e.g., $SiO_2$) or $SiN_x$ gate insulating layer 21 covering the gate 20 may be formed on the substrate 10. After forming the gate insulating layer 21, a wet washing process may be performed to reduce (or eliminate) impurities on a top surface of the gate insulating layer 21. At least one of isopropyl (IPA), deionized water, acetone or the like may be used as a washing solution in the wet washing process.

Figure 3B:
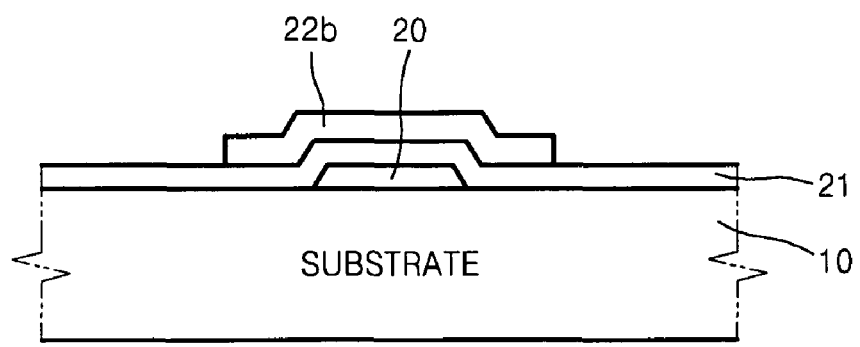

Referring to FIG. 3B, a channel layer 22b corresponding to the gate 20 may be formed on the gate insulating layer 21. The channel layer 22b may be formed using a PVD method including general sputtering and evaporation methods. If the channel layer 22b is formed using a PVD method, at least one target of $In_2O_3$, $Ga_2O_3$, ZnO or combinations thereof may be used in the PVD method. The channel layer 22b may be formed using GIZO as a primary (or main) material.

Figure 3C:
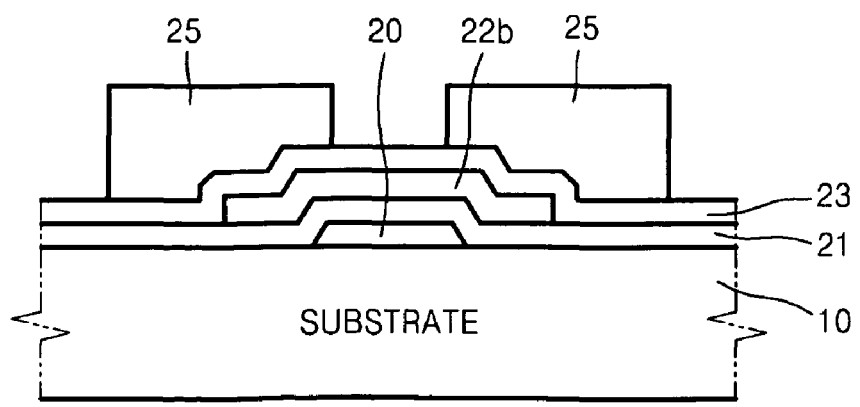

Referring to FIG. 3C, a conductive material layer 23 may be formed on the gate insulating layer 21 and the channel layer 22b to form a source electrode 23a and a drain electrode 23b at both (or opposing) sides of the channel layer 22b. A mask 25 for forming the source electrode 23a and a drain electrode 23b may be formed using a photoresist. The source electrode 23a and the drain electrode 23b may be formed using a general dry, or wet, method. In order to prevent (or reduce) damage to the channel layer 22b, a wet etching method may be used. If using a wet etching method, an etchant having phosphoric acid, nitric acid, acetic acid or the like as a primary (or main) component may be used. The conductive material layer, or the source electrode 23a and the drain electrode 23b, may be one of a molybdenum (Mo) single metal layer, a multiple-metal layer including a molybdenum (Mo) layer, a metal layer including titanium (Ti), and a metal layer including chromium (Cr). The conductive material layer, or the source electrode 23a and the drain electrode 23b may be formed of a conductive material including at least one of Mo, Ti, Pt, Cu, Al, W, MoW, AlNd, Ni, Ag, Au, IZO, ITO and combinations thereof. The conductive material layer, or the source electrode 23a and the drain electrode 23b may be formed of a silicide including at least one of Mo, Ti, Pt, Cu, Al, W, MoW, AlNd, Ni, Ag, Au, IZO, ITO and combinations thereof. The conductive material, or silicide, used to form the conductive material layer, or the source electrode 23a and the drain electrode 23b may include at least one of copper (Cu), molybdenum (Mo), aluminum (Al) and combinations thereof. The conductive material may be formed using a PVD method.

Figure 3D:
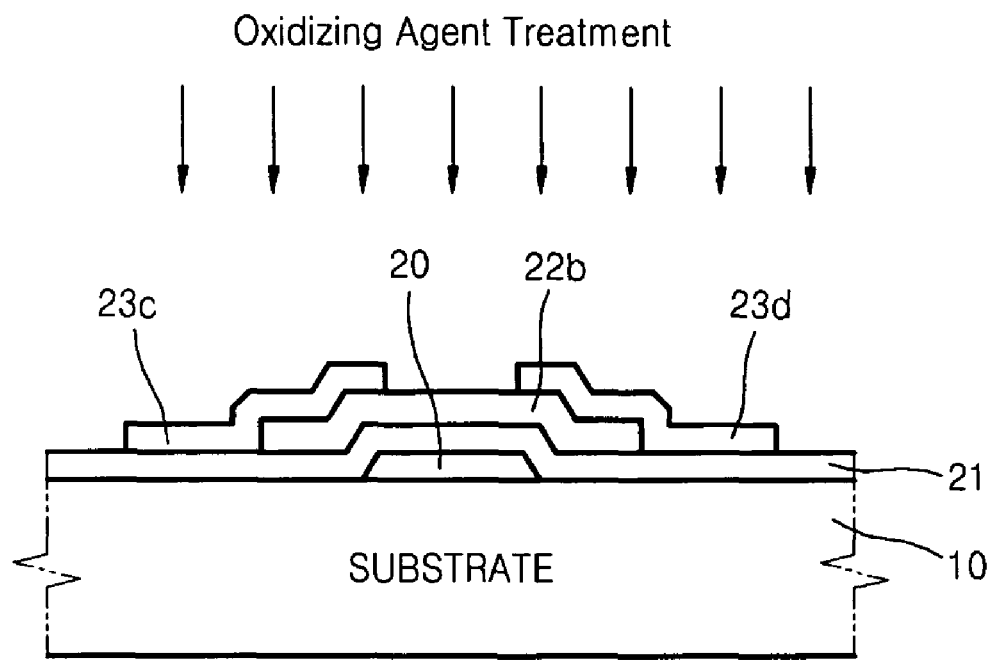

As illustrated in FIG. 3D, an oxidizing agent may be placed in contact with the channel layer 22b exposed between the source electrode 23a and the drain electrode 23b in order to reduce carriers formed on a surface of the channel layer 22b. The carriers formed on the surface of the channel layer 22b may be natural carriers that are created (or formed) during a preceding process. The carriers formed on the surface of the channel layer 22b may have a higher density than carriers below the surface of the channel layer 22b. As such, it may be necessary to treat the surface of the channel layer 22b using an oxidizing agent. The oxidation treatment may include placing a liquid oxidizing agent in contact with the surface of the channel layer 22b. The oxidation treatment may include forming a SAM on the surface of the channel layer 22b by performing an additional process. Examples of the liquid oxidizing agent include [$MnO_4$]-permanganate, [$ClO_4$]-perchlorate, peroxide compounds and combinations thereof. The SAM may be formed of a trichloro or trialkoxy silane group containing SAM, a phosphonic acid group containing SAM, HMDS or the like.

Figure 3E:
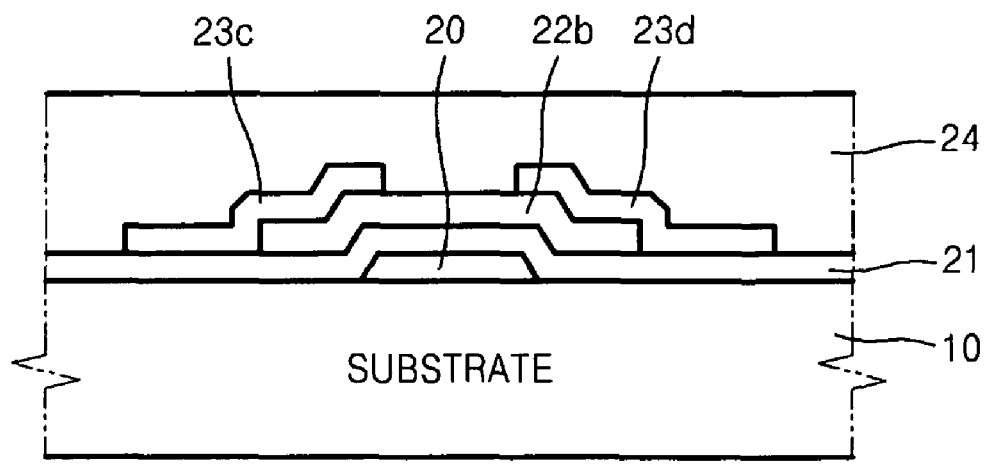

As illustrated in FIG. 3E, a passivation layer 24 may be formed on the channel layer 22b, the gate insulating layer 21, the source electrode 23a, and the drain electrode 23b using a PECVD method. The passivation layer 24 may be formed of $SiN_x$ or $SiO_x$. It may be desirable to use $SiO_x$ to control the carrier density of the channel layer 22b, which may increase due to plasma damage during formation of the passivation layer 24. The passivation layer 24 may be formed of a known organic insulating material, in addition to, the above-described inorganic materials. If a functional group capable of oxidizing the channel layer 22b is included in an organic insulating material, controlling carriers on the surface of the channel layer 22b may be controlled. According to example embodiments, if the passivation layer 24 is used to form an organic material including such a functional group, the additional oxidizing agent process and SAM formation described above may be excluded. As such, the passivation layer 24 may be formed using an organic insulating material including a functional group directly after forming the channel layer 22b. It may be necessary to cure, or anneal, the passivation layer 24 formed of an organic insulating material at a desired temperature (e.g., the passivation layer 24 may be thermally treated at about 200° C.).

The annealing process may be a furnace annealing, or a rapid thermal annealing (RTA). The annealing process may be performed at a temperature of 200° C. to 400° C. in an oxygen or nitrogen atmosphere for 10 minutes to 2 hours. The annealing process may be performed at 200° C. for an hour. The carrier density of the channel layer 22b may be reduced through the annealing process. As such, a desired TFT having desirable electrical characteristics and/or threshold voltage may be obtained.

The method of manufacturing an oxide semiconductor TFT according to example embodiments may be applied to a liquid crystal display (LCD) or an organic light emitting device (OLED), which require a substantially large surface switching device. The method according to the example embodiments may be applied to a flat panel display device that requires a switching device and a driving device based on the oxide semiconductor TFT (e.g., an LCD and an OLED). The oxide semiconductor TFT may be applied to flat panel display devices using an LCD or OLED, mobile phone or devices, laptop computers, monitors, TVs or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. For example, it will be understood by those of ordinary skill in the art that various changes in form and details of the elements of the TFT and structure thereof may be made. Also, it will be understood that the TFT according to example embodiments may be applied to, not only an LCD or OLED, but also to memory devices or logic devices. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing an oxide semiconductor thin film transistor, the method comprising:
    forming an oxide semiconductor channel layer on a substrate;
    forming source and drain electrodes at opposing sides of the channel layer; and
    oxidizing a surface of the channel layer by placing an oxidizing material in contact with the surface of the channel layer so that carriers on the surface of the channel layer decrease.

2. The method of claim 1, wherein placing the oxidizing material includes forming a liquid oxidizing agent or a self-assembled monolayer (SAM) on the surface of the channel layer.

3. The method of claim 2, wherein forming the source and drain electrodes includes forming a conductive material layer on the substrate; and patterning the conductive material layer using a wet etching process.

4. The method of claim 2, wherein the source and drain electrodes are formed after forming the channel layer such that the source and drain electrodes contact an upper portion of the opposing sides of the channel layer.

5. The method of claim 4, wherein forming the source and drain electrodes includes forming a conductive material layer on the substrate; and patterning the conductive material layer using a wet etching process.

6. The method of claim 1, wherein oxidizing the surface of the channel layer includes using an organic insulating material for manufacturing an organic passivation layer, the organic insulating material having a functional group capable of oxidizing the channel layer.

7. The method of claim 6, wherein forming the source and drain electrodes includes forming a conductive material layer on the substrate; and patterning the conductive material layer using a wet etching process.

8. The method of claim 6, wherein the source and drain electrodes are formed after forming the channel layer such that the source and drain electrodes contact an upper portion of the opposing sides of the channel layer.

9. The method of claim 8, wherein forming the source and drain electrodes includes forming a conductive material layer on the substrate; and patterning the conductive material layer using a wet etching process.

10. The method of claim 1, wherein the source and drain electrodes are formed prior to forming the channel layer such that the source and drain electrodes contact a lower portion of the opposing sides of the channel layer.

11. The method of claim 10, wherein forming the source and drain electrodes includes forming a conductive material layer on the substrate; and patterning the conductive material layer using a wet etching process.

12. The method of claim 1, wherein the source and drain electrodes are formed after forming the channel layer such that the source and drain electrodes contact an upper portion of the opposing sides of the channel layer.

13. The method of claim 12, wherein forming the source and drain electrodes includes forming a conductive material layer on the substrate; and patterning the conductive material layer using a wet etching process.

14. The method of claim 1, wherein forming the source and drain electrodes includes forming a conductive material layer on the substrate; and patterning the conductive material layer using a wet etching process.

15. The method of claim 1, wherein the oxidizing material is at least one material selected from the group consisting of $[MnO_4]$-permanganate, $[ClO_4]$-perchlorate, peroxide compounds and combinations thereof.

16. An oxide semiconductor thin film transistor, comprising:
    an oxide semiconductor channel layer on a substrate, a surface of the channel layer being oxidized by an oxidizing material that contacts the surface of the channel layer so that carriers on the surface of the channel layer decrease; and
    source and drain electrodes at opposing sides of the channel layer.

17. The oxide semiconductor thin film transistor of claim 16, wherein the oxidizing material includes a liquid oxidizing agent or a self-assembled monolayer (SAM) on the surface of the channel layer.

18. The oxide semiconductor thin film transistor of claim 16, wherein the source and drain electrodes contact a lower portion of the opposing sides of the channel layer.

19. The oxide semiconductor thin film transistor of claim 16, wherein the source and drain electrodes contact an upper portion of the opposing sides of the channel layer.

20. The oxide semiconductor thin film transistor of claim 16, wherein the oxidizing material is at least one material selected from the group consisting of $[MnO_4]$-permanganate, $[ClO_4]$-perchlorate, peroxide compounds and combinations thereof.

* * * * *